United States Patent
Letavic et al.

(10) Patent No.: US 6,661,059 B1
(45) Date of Patent: Dec. 9, 2003

(54) LATERAL INSULATED GATE BIPOLAR PMOS DEVICE

(75) Inventors: Theodore Letavic, Putnam Valley, NY (US); John Petruzzello, Carmel, NY (US); Benoit Dufort, Valhalla, NY (US)

(73) Assignee: Koninklijke Philips Electronics N.V., Eindhoven (DE)

( * ) Notice: Subject to any disclaimer, the term of this patent is extended or adjusted under 35 U.S.C. 154(b) by 0 days.

(21) Appl. No.: 10/261,254

(22) Filed: Sep. 30, 2002

(51) Int. Cl.[7] .......................... H01L 29/76; H01L 29/94; H01L 27/01; H01L 27/12; H01L 21/00; H01L 21/84; H01L 21/20; H01L 21/36; H01L 21/425; H01L 31/062; H01L 31/113; H01L 31/119; H01L 31/039

(52) U.S. Cl. ........................ 257/347; 257/344; 257/408; 438/149; 438/479; 438/517

(58) Field of Search ................. 257/347, 344, 257/408, 350, 351, 352, 353; 438/149, 479, 517, 152, 155, 156, 309, 311, 153, 154, 164, 412

(56) References Cited

U.S. PATENT DOCUMENTS 6,002,154 A * 12/1999 Fujita .......................... 257/349
6,023,090 A * 2/2000 Letavic et al. ............... 257/347
6,127,703 A * 10/2000 Letavic et al. ............... 257/347

* cited by examiner

*Primary Examiner*—Nathan J. Flynn
*Assistant Examiner*—Victor A. Mandala, Jr.
(74) *Attorney, Agent, or Firm*—Steven R. Biren

(57) ABSTRACT

A lateral insulated gate bipolar PMOS device includes a semiconductor substrate, a buried insulating layer and a lateral PMOS transistor device in an SOI layer on the buried insulating layer having a source region of p-type conductivity. A lateral drift region of n-type conductivity is provided adjacent the body region, and a drain region of the p-type conductivity is provided laterally spaced from the body region by the drift region. An n-type conductivity drain region is formed of a shallow n-type contact surface region inserted into a p-inversion buffer. A gate electrode is provided over a part of the body region in which a channel region is formed during operation and extending over a part of the lateral drift region adjacent the body region, with the gate electrode being insulated from the body region and drift region by an insulation region.

7 Claims, 2 Drawing Sheets

LATERAL INSULATED GATE BIPOLAR PMOS DEVICE

BACKGROUND AND SUMMARY OF THE INVENTION

The present invention relates to the field of Semiconductor-On-Insulator (SOI) devices, and relates more particularly to lateral SOI PMOS devices suitable for high-voltage applications.

In fabricating high-voltage power devices, tradeoffs and compromises must typically be made in areas such as breakdown voltage, size, "on" resistance and manufacturing simplicity and reliability. Frequently, improving one parameter, such as breakdown voltage, will result in the degradation of another parameter, such as "on" resistance.

A known form of lateral thin-film SOI device includes a semiconductor substrate, a buried insulating layer on the substrate, and a lateral transistor device in an SOI layer on the buried insulating layer, with the device, such as a MOSFET, including a semiconductor surface layer on the buried insulating layer and having a source region of a first conductivity type formed in a body region of a second conductivity type opposite to that of the first, an insulated gate electrode over a channel region of the body region and insulated therefrom, a lateral drift region of the first conductivity type, and a drain region of the p-conductivity type laterally spaced apart from the source region by the drift region.

A device of this type is disclosed in U.S. Pat. No. 6,127,703, commonly-assigned with the instant application and incorporated herein by reference. The device of the aforementioned patent is a lateral SOI PMOS device having various features, such as a thin SOI layer with a linear lateral doping region and an overlying field plate, to enhance operations. This device is a p-channel or PMOS transistor, with p-type source and drain regions, manufactured using a process conventionally referred to as MOS technology. This PMOS device is configured with a heavily-doped p-type drain region, a moderately doped p-type drain buffer region, and a lightly-doped p-type drain extension region; having the drawback that all on-state current flow is forced to flow through the lightly-doped surface p-type drain extension region. This design relies on a low doping level in the p-extension to maintain a high breakdown voltage, resulting in a very high operating resistance.

The invention provides a lateral insulated gate bipolar PMOS device in which an n-type lateral drift region is provided with a linearly-graded charge profile such that the doping level in the lateral drift region increases in a direction from the drain region toward the source region, and in which a surface-adjoining n-type conductivity implant is added to the moderately-doped p-type drain buffer region and the lightly-doped p-type drain extension region; the lightly-doped drain extension region is formed throughout the surface of the n-type drift region extending from the drain towards the source, but not in direct contact with, the source region. This results in the formation of a dual-drain PMOS device in which both an n-type and a p-type terminal are available for current flow.

In a preferred embodiment of the invention, an anode is formed by implantation of SN (shallow N) into PI (p-inversion) buffer region in at least a portion of the drain region to permit an increase in total on-state current flow and reduced resistance.

In a further preferred embodiment of the invention, the conductive field plate is connected to the source region of the PMOS device.

Lateral insulated gate MOS devices in accordance with the present invention offer a significant improvement in that a combination of enhanced performance characteristics, especially, for example, current flow and on resistance, making the devices suitable for operation in a high-voltage, high-current environment, and in particular high breakdown voltage, can be achieved in a relatively simple and economical design capable of implementing PMOS structures using conventional technology.

However, the present invention recognizes that increased current flow may be provided for by implementing a MOS device having a dual current path for such current flow. These and other aspects of the invention will be apparent from and elucidated with reference to the embodiments described hereinafter.

BRIEF DESCRIPTION OF THE DRAWINGS

The invention may be more completely understood with reference to the following description, to be read in conjunction with the accompanying drawing, in which.

Figure 1:
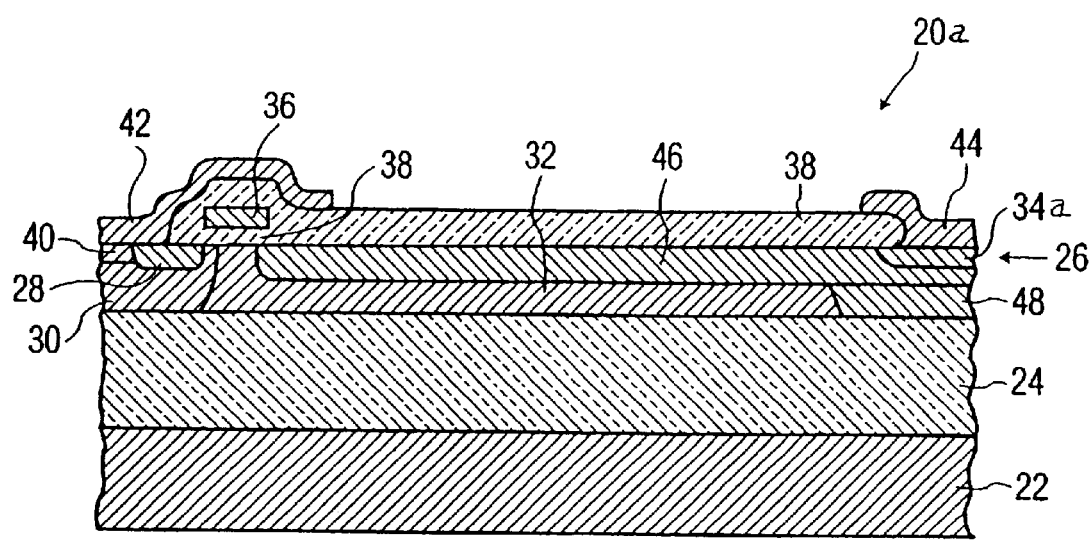
FIG. 1 shows a diagrammatic cross-sectional view of a lateral thin-film SOI PMOS device of the prior art.

In the drawings, semiconductor regions having the same conductivity type are generally shown hatched in the same direction in the cross-sectional views, and it should be understood that the figures are not drawn to scale.

DETAILED DESCRIPTION OF THE INVENTION

In the simplified cross-sectional view of FIG. 1, a lateral thin-film device as disclosed in U.S. Pat. No. 6,127,703, an SOI PMOS transistor 20a, includes a semiconductor substrate 22, a buried insulating layer 24, and a semiconductor surface SOI layer 26 in which the device is fabricated. The PMOS transistor includes a source region 28 of a p-type conductivity, a body region 30 of n-type conductivity, a lateral drift region 32 of n-type conductivity and a drain region 34a of p-type conductivity. The basic device structure also includes a gate electrode 36, shown as completely insulated from the underlying semiconductor surface layer 26 and other conductive portions of the device by an oxide insulation region 38.

Additionally, the PMOS transistor 20a includes a body contact surface region 40, in contact with source region 28, located in the body region 30 and of the same conductivity type as body region 30 but more highly doped than body region 30. Electrical contact to source region 28 is provided by a source contact electrode 42, while the drain region 34a is provided with a drain contact electrode 44. PMOS transistor 20a is provided with a surface-joining p-type conductivity drain extension region 46 in drift region 32 and extending from the area of p-type drain region 34a to adjacent to, but not in direct contact with, source region 28. Additionally, a buffer region 48 of p-type conductivity is provided in the drift region 32 and extends below drain region 34a from the drain extension region 46 down to the buried insulation layer 24.

Figure 2:
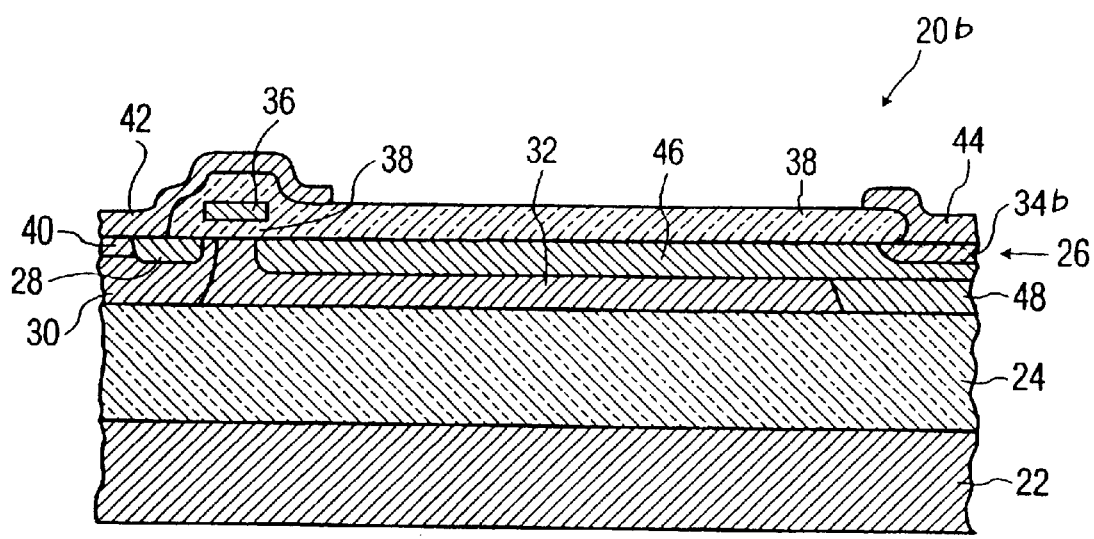
FIG. 2 shows a diagrammatic cross-sectional view of a lateral thin-film insulated SOI bipolar PMOS device in accordance with the invention.

Referring now to FIG. 2, an illustration of the present invention is shown in schematic form. As will be recognized by those of skill in the art, PMOS transistor 20a of the prior art has been substantively modified from the device depicted in FIG. 1 to be a lateral insulated gate bipolar PMOS device 20b. As described above in relation to PMOS transistor 20a, bipolar PMOS device 20b has a substrate layer 22, formed of a semi-conducting material, upon which is superimposed an insulating layer 24 and an SOI surface layer 26. Surface SOI layer 26 includes a p-type source region 28, an n-type body region 30, an n-type lateral drift region 32 having a linearly graded charge profile increasing in doping level from drain to source, a gate electrode 36 and an insulation region 38, preferably of an oxide. A highly doped n-type body contact region 40 is in contact with source region 28, located in body region 30, with source region 28 connected to source contact electrode 42.

The present invention, however, establishes drain region 34b with n-type conductivity implantation as a secondary electrical path anchor. The establishment of n-type drain region 34b creates a lateral insulated surface oriented gate transistor that is operable in parallel with a lateral insulated gate surface-oriented transistor, thus providing a second current path and effectively reducing on-resistance of the device. The device provides a near-surface path shallow-p PMOS component and a buried shallow n/p-buffer/n-drift/n-body path to support greater current flow than previously possible.

Figure 3:
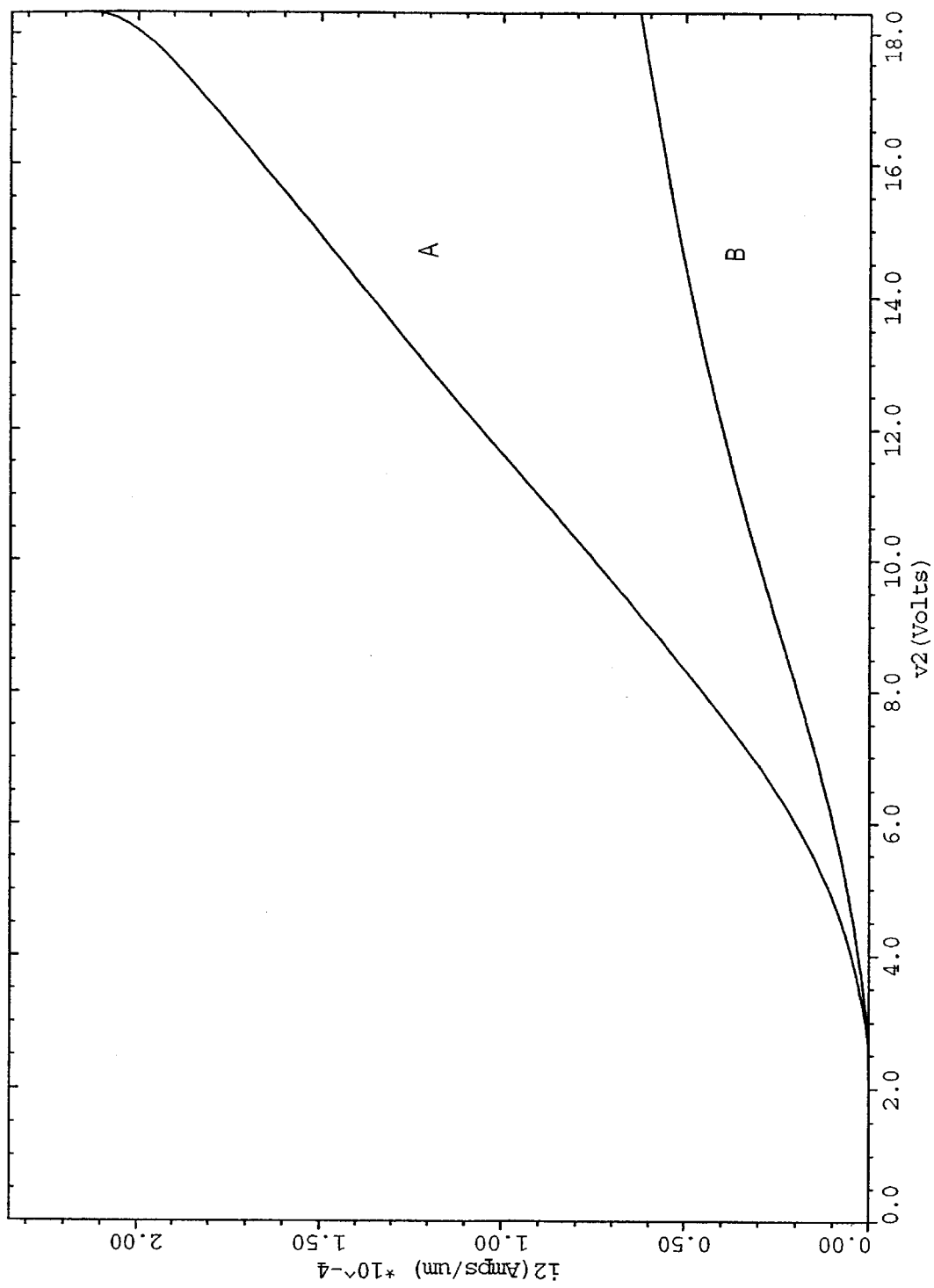
FIG. 3 is a simulated performance chart comparing the prior art PMOS device with the bipolar PMOS of the present invention.

Referring now to FIG. 3, a chart is provided comparing the conductivity performance of the bipolar PMOS device of the present invention with the PMOS device as described in prior Pat. No. 6,127,703. As is shown, performance of the prior art PMOS device is depicted in line B as gradually increasing current as voltage increases. The predicted performance of the present invention bipolar PMOS device is shown in line A. By having dual conductivity paths, the present invention achieves a current/voltage slope that approximates a three-fold increase in current carrying capacity over the prior art throughout the forward voltage regime visible on the graph. For this simulated performance, the gate and drain are grounded and the source is pulled up. As described above, the current flows through parallel conductivity paths.

While the present invention is described with respect to specific embodiments thereof, it is recognized that various modifications and variations may be made without departing from the scope and spirit of the invention, which is more clearly and precisely defined by reference to the claims appended hereto.

What is claimed is:

1. A lateral thin film insulated gate bipolar PMOS device comprising:

a semiconductor substrate, a buried insulating layer on said substrate, and a lateral PMOS device in an SOI layer on said buried insulating layer and having a source region of p-type conductivity formed in a body region of n-type conductivity, a lateral drift region of n-type conductivity, adjacent said body region is a drain region of n-type conductivity and laterally spaced apart from said body region by said lateral drift region, and a gate electrode over a part of said body region extending over a part of said lateral drift region adjacent said body region, said gate electrode being insulated from said body region by an insulation region, said lateral drift region being provided with a linearly graded charge profile over a major portion of its lateral extent such that the doping level in said lateral drift region increases in a direction from said drain region toward said source region, and wherein said source region, said drift region, and said drain region form a bipolar transistor that operates to provide an additional current path when said PMOS device is in the on state, thereby reducing on resistance of said PMOS device.

2. The bipolar PMOS device of claim 1, wherein said drain region comprises a shallow-n type body contact surface region formed in a p-inversion buffer region.

3. The bipolar PMOS device of claim 1, wherein said n-type body region is formed from a portion of said n-type drift region.

4. The bipolar PMOS device of claim 1, further comprising an n-type body contact surface region formed in said body region in contact with said source region.

5. The bipolar PMOS device of claim 1 wherein a drain extension region is provided in said drift region and extends from said drain region to adjacent to but not in direct contact with, said source region.

6. The bipolar PMOS device of claim 1 wherein said drain region also serves as an emitter of a bipolar transistor when said PMOS device is in an on state.

7. The bipolar PMOS device of claim 6 wherein said source region also serves as a collector region of a bipolar transistor when said PMOS device is in an on state.

* * * * *